United States Patent [19]

Hayden et al.

[11] Patent Number: 5,579,207
[45] Date of Patent: Nov. 26, 1996

[54] THREE-DIMENSIONAL INTEGRATED CIRCUIT STACKING

[75] Inventors: Warren Hayden, Redondo Beach; David K. Uyemura, Torrance; Richard E. Burney, Long Beach; Christopher M. Schreiber, Lake Elsinore; Jacques F. Linder, Palos Verdes, all of Calif.

[73] Assignee: Hughes Electronics, Los Angeles, Calif.

[21] Appl. No.: 326,455

[22] Filed: Oct. 20, 1994

[51] Int. Cl.$^6$ ........................................ H05K 1/08
[52] U.S. Cl. .................. 361/790; 174/261; 257/786; 361/764; 361/795; 439/69
[58] Field of Search ............... 174/252, 52.3, 174/260, 261, 262, 263; 439/68, 69, 74; 257/778, 785, 786, 778, 787; 361/704, 712, 735, 761, 764, 767, 778, 790, 792, 795

[56] References Cited

U.S. PATENT DOCUMENTS

| | | | |
|---|---|---|---|
| 4,225,900 | 9/1980 | Ciccio | 361/778 |
| 4,320,438 | 3/1982 | Ibrahim | 361/764 |
| 4,539,622 | 9/1985 | Akasaki | 361/764 |
| 4,551,746 | 11/1985 | Gilbert | 357/74 |
| 5,239,448 | 8/1993 | Perkins | 361/764 |
| 5,280,414 | 1/1994 | Davis | 361/795 |
| 5,371,654 | 12/1994 | Beaman | 174/261 |
| 5,435,733 | 7/1995 | Chernicky | 439/68 |

FOREIGN PATENT DOCUMENTS

| | | |
|---|---|---|
| 486829 | 5/1992 | European Pat. Off. . |
| WO88/05251 | 7/1988 | WIPO . |

OTHER PUBLICATIONS

"3-D packaging using low-temperature cofired ceramic (LTCC)", E. G. Palmer et al, International Journal of Microcircuits & Electronic Packaging, 16 (1993) 4th quarter, No. 4, Reston, VA, USA, pp. 279–284.

"Organic card device carrier", Research Disclosure, May 1990, No. 313, Emsworth, GB. 1 page.

Primary Examiner—Gerald P. Tolin
Attorney, Agent, or Firm—M. W. Sales; W. K. Denson-Low

[57] ABSTRACT

A plurality of integrated circuit chips (12) are packaged in a stack of chips in which a number of individual chip layers (10,120,130,132,134) are physically and electrically interconnected to one another and are peripherally sealed to one another to form an hermetically sealed package having a number of input/output pads (137a,139a,141a,156,158,160) on the surface of the upper (132) and lower (134) layers. Each chip layer comprises a chip carrier substrate having a chip cavity (22) on a bottom side and having a plurality of electrically conductive vias (40,42,44) extending completely around the chip cavity. Each substrate is formed with a peripheral sealing strip (46,48) on its top and bottom sides and mounts on its top side a chip that has its connecting pads (14) wire bonded to exposed traces (32,34) of a pattern of traces that are formed on the top side of the substrate and on intermediate layers (16,18,20) of this multi-layer substrate. The traces interconnect with the vias (40,42,44) that extend completely through the substrate, and each via is provided at the top and bottom sides of the substrate with a via connecting pad (40a41b), with the via pads on top and bottom sides all being arranged in identical patterns. Solder on the via pads and on the sealing strips is reflowed to effect a completely sealed package and to interconnect vias in each layer with vias in each other layer.

18 Claims, 3 Drawing Sheets

THREE-DIMENSIONAL INTEGRATED CIRCUIT STACKING

The United States government has rights in the present invention pursuant to Contract No. DASG 60-90-C-0135, issued by the Department of the Army.

BACKGROUND OF THE INVENTION

1. Field of the Invention

The present invention relates to packaging of integrated circuit chips and more particularly concerns an improved three-dimensional package of stacked integrated circuit chips.

2. Description of Related Art

As electronic circuits become larger and more complex, increased efforts continue to be directed toward the goal of decreasing size of circuit packages. In some types of multi-chip modules, many integrated circuit chips are mounted side by side in close proximity to one another on a multi-layered substrate so that adjacent chips may be connected to one another by means of connecting leads that extend in a number of different planes, thereby decreasing horizontal dimensions of the package at the expense of some increase in vertical dimension.

Integrated circuit chips have also been stacked vertically one upon another to provide decreased size, weight and power as compared to conventional single chip or multiple horizontally aligned chip packaging. However, because of the large number of chip connecting pads, which may be in excess of four hundred on a single chip, for example, it is difficult, in prior arrangements, for chip stacking to adequately provide interconnections from all of the chip pads to one another as desired, or to external circuitry. In prior chip stacking arrangements interconnecting leads between chips on different levels are provided at the sides of the stack. Leads are routed from each chip connecting pad to the side of the stack, and interconnections are made in the form of vertical connectors or vertical buses that extend along the exterior sides of the stack. Because the vertical surface area of the sides of the stack is limited, the number of input/output connections between the chip connecting pads of the chips of a stack and connecting elements at the outside of the stack is itself severely limited. In prior chip stacks, connecting leads from the chip connecting pads have been routed to one side of the stack so as to most conveniently form the vertical interconnects between stack layers and connections. This has been done in the past by adding metallization or additional leads on the chip or using other interconnect techniques, such as tape automated bonding. These techniques require special processing of the chips or wafers and add considerable cost to the stacking process. Without the use of special chip or wafer processing to allow stacking in the prior art, the input/output connections for interconnecting stack layers are limited in number. Thus, standard chips that are not specially processed for stacking cannot be stacked without severe limitations on input/output connections.

Accordingly, it is an object of the present invention to provide integrated circuit chip packaging that avoids or minimizes above mentioned problems.

SUMMARY OF THE INVENTION

In carrying out principles of the present invention in accordance with a preferred embodiment thereof, a plurality of stacked chip layers is provided wherein each chip layer comprises a substrate or chip carrier having a number of electrically conductive vias extending between its top and bottom sides, with via connecting pads formed on the top and bottom sides of each via. A pattern of electrically conductive traces is formed on one side of the substrate, at least some of which are connected to some of the via pads. An integrated circuit chip is mounted on the other side of the substrate with its connecting pads wire bonded to some of the electrically conductive traces. The chip layers are arranged in a stack with the vias of each layer aligned with the vias of an adjacent layer and with the via pads on top and bottom sides of each layer being electrically and mechanically connected to via pads on bottom and top sides, respectively, of adjacent layers.

DESCRIPTION OF THE PREFERRED EMBODIMENTS

Figure 1:
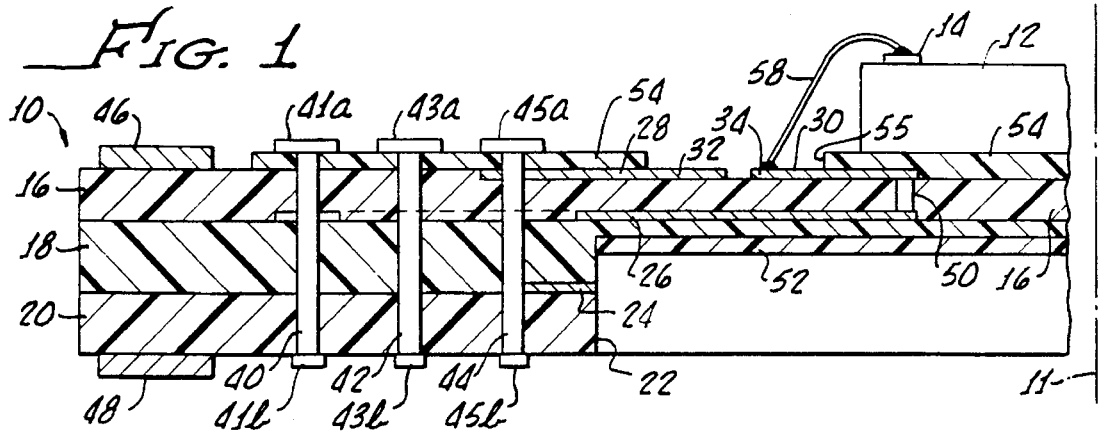
FIG. 1 is an enlarged sectional view of one half of a symmetrical single chip layer showing a chip and chip carrier embodying principles of the present invention.
Figure 2:
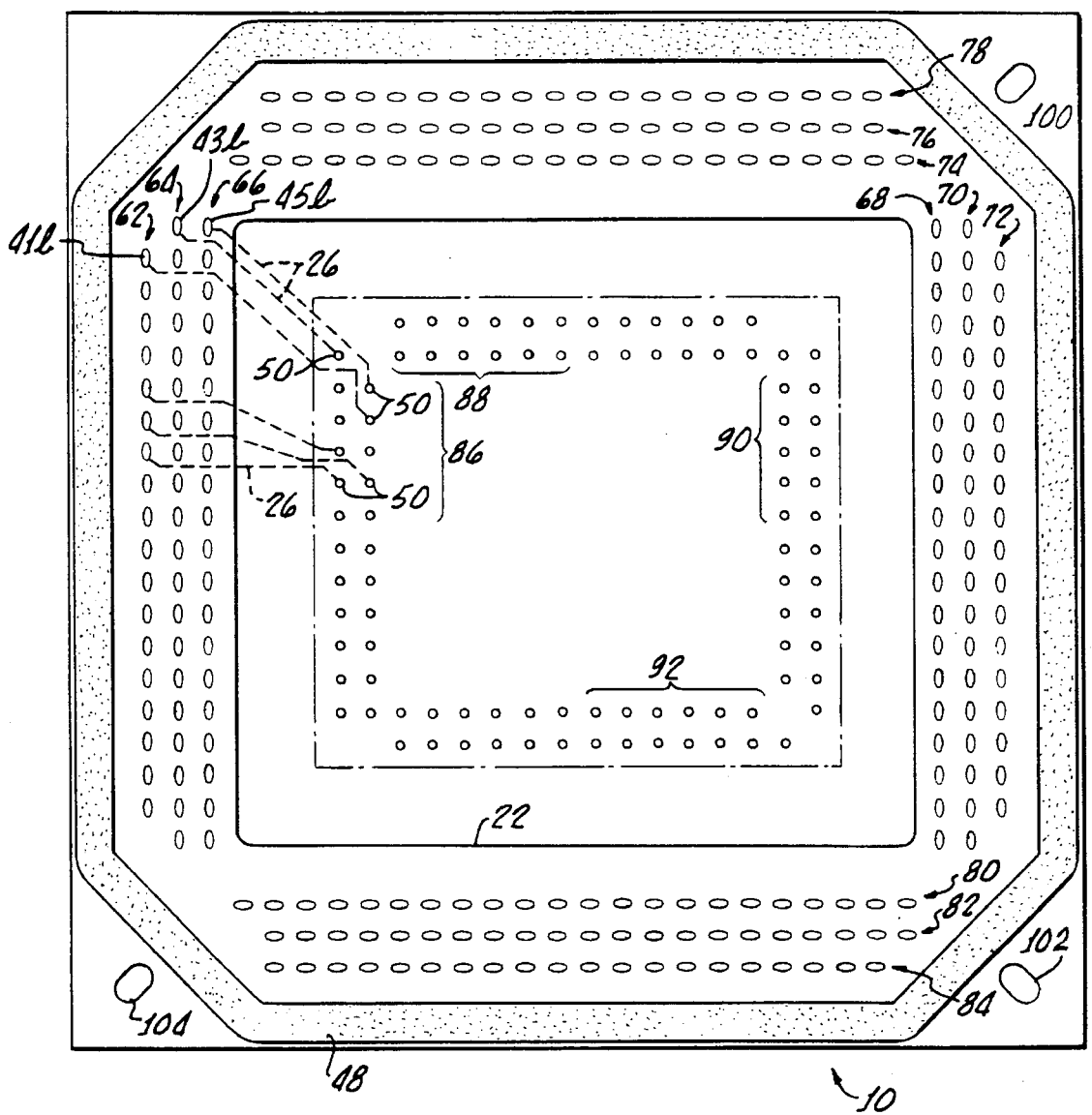
FIG. 2 is a view of the bottom side of the chip carrier of the chip layer of FIG. 1.
Figure 4:
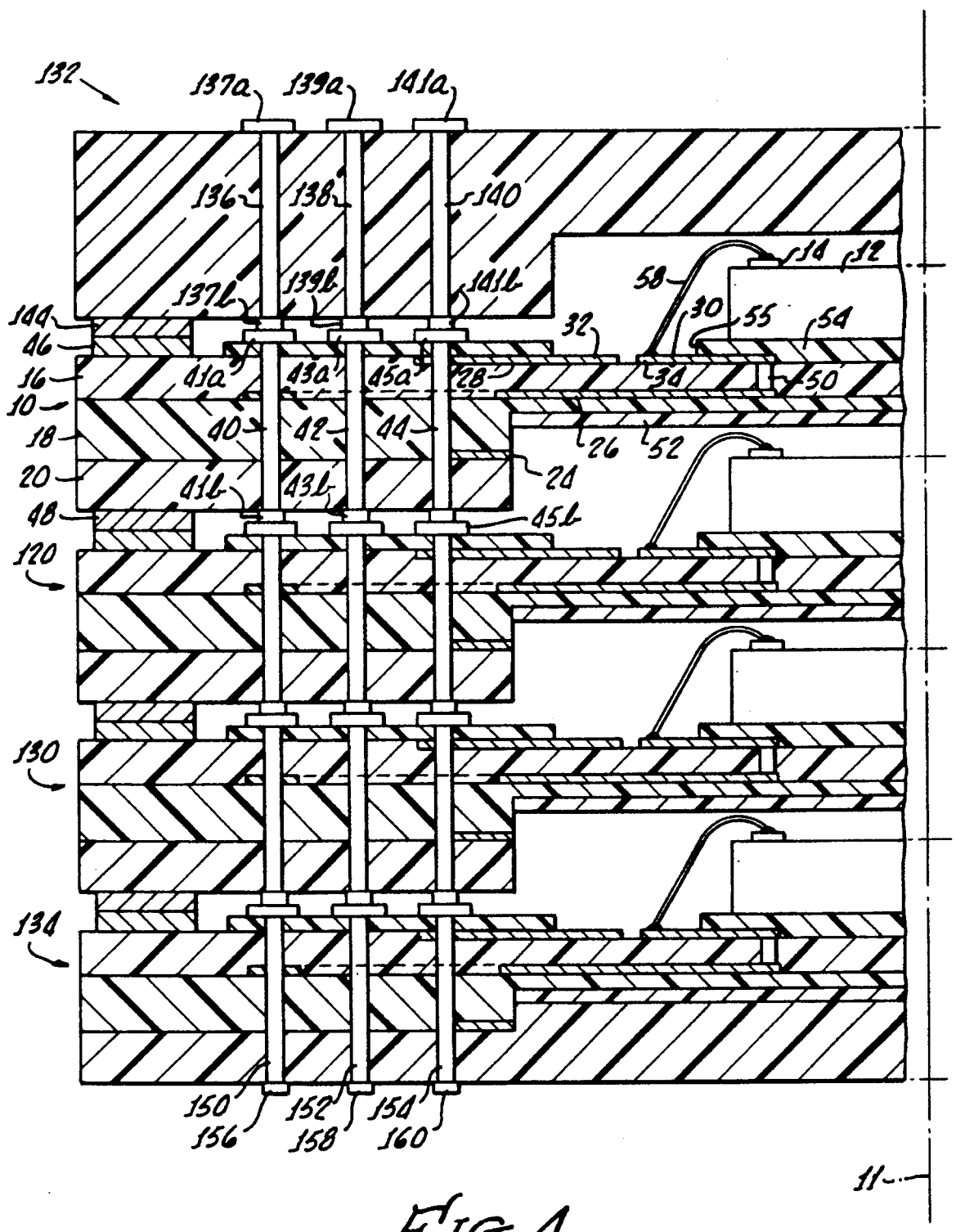
FIG. 4 is a sectional view of an exemplary stack of chip layers.

Illustrated in FIG. 1 is a single chip layer. The single chip layer in FIG. 1 shows a chip carrier, or substrate 10, carrying a single chip 12. FIG. 2, for convenience of illustration, shows only one half of the chip carrier and chip, which may be symmetrical about the center line 11. This layer is to be assembled in a stack of chip layers, each with a mounted chip, as illustrated in FIG. 4. This figure shows a sectional view of one half of a complete hermetically sealed stack of integrated circuit chips, for a stack that is symmetrical about centerline 11.

Figure 3:
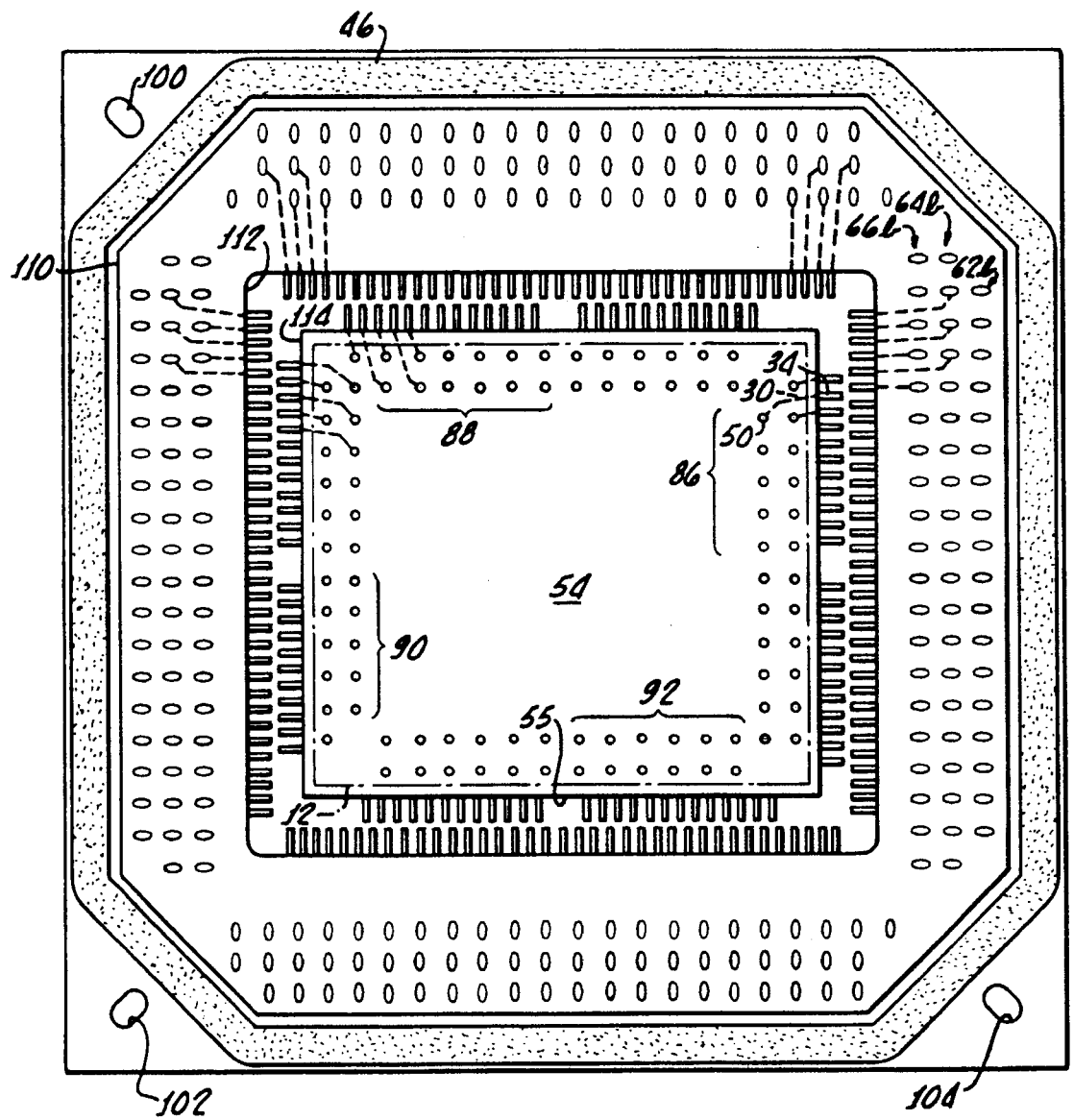
FIG. 3 is a view of the top side of the chip carrier of FIG. 1, showing the chip in phantom lines.

The single chip layer of FIG. 1 comprises a substrate or chip carrier, generally indicated at 10, upon which is mounted a conventional integrated circuit chip 12 having a plurality of chip connecting pads, such as pad 14 shown in FIG. 1. Chip carrier 10 may either be a single layer solid substrate or, as shown in FIG. 1, a multi-layer substrate formed of any suitable number of layers, such as first, second and third substrate layers 16,18 and 20. The carrier 10, in the embodiment illustrated in the drawings, is of generally rectangular configuration, as can be seen in FIGS. 2 and 3, and has a symmetrically and centrally located cavity 22 formed in its bottom. Each of the substrate layers has a pattern of electrically conductive traces formed thereon for interconnection of various elements, as will be described below. Thus, for example, traces 24 are formed on the upper surface of lower layer 22, traces 26 are formed on the upper surface of intermediate layer 18, and traces 28,30 are formed on the upper surface of upper layer 16. In this arrangement traces 28 and 30 have exposed bond finger portions 32 and 34, respectively (see FIGS. 1 and 3).

The various substrate layers are formed of very thin (from about 1 to 10 mil thickness) dielectric ceramic, such as alumina, aluminum oxide ($Al_2O_3$), aluminum nitride (AlN), or other suitable nonconductive material.

Extending through the thicker part of the substrate, surrounding the cavity 22, are rows of vias, such as vias 40,42, and 44, filled with an electrically conductive material, such as a tungsten paste, for example, and extending continuously from the top side of the carrier to its bottom side. For convenience of exposition, the top side of the carrier is the side that is deemed to be uppermost as viewed in FIG. 1, and the bottom side is the side that is lowermost. Each of the vias has a via pad, such as pads 41a and 41b, 43a and 43b, and 45a and 45b, electrically and mechanically connected to the top and bottom ends of the via, respectively.

Running continuously around the peripheral edge of both the top side and bottom side of the carrier substrate 10 are a continuous top side seal strip 46 and a continuous bottom side seal strip 48. Additional vias, such as a via 50, extend through the thinner part of the substrate above cavity 22 to interconnect certain of the trace patterns on different layers of the single carrier, such as for interconnection of trace 30 with trace 26. A very thin (in the order of a fraction of a mil in thickness) dielectric protective inner cavity layer 52 is bonded to the bottom of the cavity 22, that is, to the lowermost portion of the thin inner portion of the carrier substrate, to shield leads running along the lower surface of this portion of the substrate. A similar thin dielectric outer cavity cover layer 54 of a rectangular configuration for this rectangular configuration chip carrier overlies and is bonded to the uppermost layer 16 of substrate 10. Cover layer 54 has a peripheral edge 55 (see also FIG. 3) which is positioned to expose free ends of all of the upper layer leads 34. Thus, outer cavity cover layer 54 protects inner portions of leads 30 but leaves an exposed portion 34 that is available for bonding to a bond wire 58 to connecting pads 14 of the chip 12. The latter is mounted by a suitable adhesive (not shown) on the upper surface of cover layer 54. The chip may have a size equal to but preferably not greater than the dimensions of the cover layer 54 so that edges of the chip do not extend beyond, and are preferably set back somewhat from, the peripheral edge 55 of the cover layer 54. Chip 12 is shown in phantom lines in FIG. 3.

All of the electrically conductive traces, all of the via pads, and all of the seal strips are preferably formed by the same process, using the same material. To form these elements, a tungsten paste is screened onto the substrate layer and then fired together with the individual substrate layer to cause the paste to solidify and to become bonded to the layer. Thereafter the fired tungsten paste is covered with a barrier layer of nickel and then a very thin outermost layer of gold (for at least the exposed areas). To all of the via pads and to all of the peripheral seal strips, but not to any of the other traces, is thereafter applied a thin coat of a high temperature reflowable solder. Certain pads or bumps on the bottom of a stack to be used to mount the stack may be formed of a relatively low temperature solder, as will be described below.

The via top and bottom pads are each elongated, having an aspect ratio of about 3:1, that is, a length of three times the width. The via pads are oriented so that when several carriers are stacked, as shown in FIG. 4, with the via pad at the top side of one carrier in contact with the via pad at the bottom side of an adjacent carrier to form a pair of contacting via pads, the two elongated pads of a single pair of contacting via pads are angulated with respect to one another, and preferably positioned at right angles to each other, as shown FIG. 5. In this figure is shown, for example, a via pad 41a that is positioned at the top side of via 40 of a lower layer and in contact with a via pad 137b at the bottom side of an immediately higher layer.

As can be seen in the carrier bottom view of FIG. 2, the vias (the via pads of the outer three rows of vias are seen in this figure) are arranged in parallel rows on each of the four sides of the carrier cavity 22. Thus, a row of via pads including lower side via pad 41b is identified in FIG. 2 as via pad row 62 (extending vertically in FIG. 2). A row including via pad 43b is identified as vertically extending row 64, and a row of via pads including via pad 45b is identified as vertically extending row 66. Thus, there are three parallel rows of vias extending along the left side of the cavity on the carrier (as viewed in FIG. 2) with the rows being parallel. In this case, all of the vias of these three rows have their longitudinal axes aligned in directions parallel to the extent of the several rows (e.g., vertically, as viewed in FIG. 2). A similar set of three via pad rows 68,70,72 (including the associated vias, of course) are arranged in an identical pattern along the right side of the cavity 22. Similarly, along the top and bottom side of the cavity are arranged groups of horizontally extending via rows 74,76,78 on the top side of the cavity, as viewed in FIG. 2, and horizontal via rows 80,82 and 84 on the bottom side of the cavity. Again, all the vias have their longitudinal axes parallel to one another in each row and in each group of rows and parallel to the extent of the rows. In the particular arrangement illustrated, however, the longitudinal axes of the vertically extending rows of vias 62,64,66,68,70,72 are all parallel to one another and perpendicular to the longitudinal axes of horizontally extending via rows 74–84.

Each of the vias of the inner pair of rows, such as rows 64,66,68,70,74,76,80,82, are connected to leads buried within the thin portion of the substrate layer above the cavity, such as lead 26 (FIGS. 1 and 2) which connects to via 40 (FIG. 1) and to one of the vias 50 (FIGS. 1 and 3) extending through the thin portion of the substrate above the cavity. For example, via pad 41b is connected via lead 26, on layer 18, and via 50 (through layer 16) to the lead 30 which has an end portion 34 exposed for connection to a bonding wire 58 and chip pad 14.

A group of the vias are designated herein as cavity vias and generally indicated in FIGS. 2 and 3 by numeral 86 (which include the via 50), which, like the via 50, extend through the thin portion of the upper layer 16 for connection to different ones of leads on the surface of the upper layer 16. The cavity vias 86 are each connected by buried leads analogous to lead 26 to a different one of the vias in the row of vias indicated at 62 (FIG. 2). Similarly, additional groups of cavity vias 88,90 and 92 are connected by buried leads to respective ones of the vias in outer via rows 78,72 and 84, respectively. To maintain clarity of the drawings, only some of these buried leads are shown, but the general pattern of leads is as illustrated. Cavity vias 86,90 and 92 all extend through the thinner portion of the substrate layer above the cavity 22 and are individually connected to respective ones of leads, such as leads 30, formed on the uppermost surface of the layer 16 above the cavity. To relatively orient FIGS. 2 and 3, the top of carrier 10, as illustrated in FIG. 3, merely is turned over so that the right side of the carrier, as viewed in FIG. 3, becomes the left side of the turned over carrier as viewed in FIG. 2, and the left side of the carrier as seen in FIG. 2 becomes right side of the carrier as seen in FIG. 3. For example, as seen in the carrier bottom view of FIG. 2, the carrier includes three registration openings 100,102, and 104 at three different corners of the carrier. In the carrier top view of FIG. 3, registration opening 100 is seen at the upper left corner, whereas the other side of this same opening is seen in the upper right corner of FIG. 2. Similarly, opening 102 is seen in the lower right corner of FIG. 2 and in the lower left corner of FIG. 3. The nature, purpose and function of these registration openings and the significant and important improvements accomplished thereby will be described in detail below.

As mentioned above and as seen in FIG. 3, the top side of each of the cavity vias 86,88,90 and 92 are covered by a very thin (a fraction of a mil) dielectric layer 54 which covers the cavity via groups and portions of the conductive leads on the upper surface of the upper carrier layer. Also shown in FIG. 3 in phantom lines is the outline of the integrated circuit chip 12 that will be adhesively bonded to the uppermost surface of the thin dielectric cover layer 54.

A generally rectangular ring shaped cover layer 110, also formed of a very thin dielectric material, such as a ceramic, alumina or the like, covers the uppermost surface of the upper layer of carrier 10 and extends completely around the outer cavity cover layer 54. The inner periphery 112 of the ring shaped cover layer is spaced from the outer periphery 114 of the outer cavity cover layer 54 so as to expose portions of the traces collectively indicated at 28 and 30. As indicated above, these exposed portions of the traces are arranged for connection of bond wires, such as wire bond 58, that are also bonded to the chip connecting pads 14. The exposed traces, such as trace 38, are connected by leads 28 (FIGS. 1 and 3), which are covered by the ring shaped cover layer 110 to respective ones of the via pads of via pad rows 64b,66b. FIG. 3 also shows the groups of three rows of vias on each side of the carrier (actually only the via pads on the upper sides of the vias are seen in the figure) with via rows 62b,64b,66b corresponding respectively to via rows 62,64, and 66 of FIG. 2.

It is to be noted, however, that the elongated via pads on the top side of vias in rows 62b,64b,66b, though all parallel to one another, have their longitudinal axes all perpendicular to the direction of the respective rows. Importantly, these longitudinal axes are perpendicular to the longitudinal axes of the corresponding via pads on the bottom side of the same via. That is, any one via of the vertically extending rows has a vertically oriented pad on its bottom side (vertical as seen in FIG. 2) and the same via has a horizontally oriented via (as seen in FIG. 3) on its top side.

The purpose of this orthogonal pad orientation is to provide overlapping connecting pairs of via pads overlapping as shown in the configuration illustrated in FIG. 5, as will be more particularly described below. Thus, each via has a top side pad oriented in one direction and a bottom side pad oriented in a perpendicular direction, as can be seen from the illustrations of FIGS. 2 and 3. The via pads of the inner rows of the top side pads of via rows 64 and 66 are connected by traces, such as trace 28, partially buried beneath the ring shaped cover layer 110 and having exposed end portions, such as exposed end portion 32 of trace 28. Wire bonds from the individual chip connecting pads 14 are connected respectively to different ones of the exposed ends 32,34, etc. of the partially buried traces, which are connected at their other ends to individual ones of the cavity vias that extend through the upper carrier layer.

As can be seen in each of FIGS. 2 and 3, the continuous seal strip 48, on the bottom side of the substrate, and strip 46, on the top side of the substrate, extend around the entire periphery of both top and bottom sides of the substrate.

Illustrated in FIG. 4 is an exemplary stack formed of three intermediate chip layers 10,120, and 130, each of which may be identical to the single chip layer shown in FIGS. 1, 2 and 3, and including a lid or uppermost layer 132 and a base or lower layer 134. The upper layer 132 is identical to the intermediate chip layers 10,120 and 130 except for the fact that no chip is mounted on its upper surface and none of the connecting leads necessary for connection of the chips pads are needed or used. However, this upper layer also includes electrically conductive tungsten filled vias 136,138 and 140, having top and bottom pads 137a and 137b, 139a and 139b, and 141a and 141b on top and bottom sides of the respective vias 136,138,140. The uppermost layer or lid 132 also is formed with a continuous peripheral seal 144 on its lower surface. No such seal is needed, of course, on its upper surface.

In a like manner, the lowermost layer or base 134 is identical to the intermediate layers 10,120 and 130. Its three electrically conductive tungsten filled vias 150,152, and 154 are provided with top side via pads just the same as are provided for the intermediate layers 10,120 and 130 but may be provided with smaller pin type via pads 156,158, and 160, respectively, that are specifically configured and arranged to be received in solder wells (not shown) on a PC board or other mounting substrate for making physical and electrical connection of the stack to the mounting substrate.

As can be seen in FIG. 4, the via pads of the successive layers are in physical, mechanical and electrical contact with one another in the stack. So too the peripheral seals on top and bottom sides of adjacent layers are in hermetically sealing contact with one another to provide a complete hermetic seal for the entire package.

An exemplary sequence of assembling procedures is as follows:

Each ceramic carrier of one or multiple layers with vias, traces and registration openings is formed. The several traces are formed by screened-on tungsten paste fired together with the layer and then covered with a nickel barrier and a thin gold layer, where appropriate. The vias are filled with a suitable conductive compound, such as a tungsten paste, which is fired together with the individual layers, the tungsten traces, seal strips and via pads. Thereafter the carrier substrate has applied to its upper surface the thin dielectric ceramic inner and outer cover layers 52,54 and ring shaped cover layer 110, which are suitably bonded thereto, and, as previously mentioned, may have a thickness of a fraction of a mil. The high temperature solder coats the continuous seal strips and via pads are then silk-screened on top and bottom sides of the carrier. Each carrier is now available for mounting of its die integrated circuit chip. The chip is adhesively secured to (as by an epoxy, for example) the cover layer 54 and its chip connecting pads wire bonded to different ones of the exposed traces 32,34. After completion of each chip layer, that is, after mounting of a chip of an individual carrier substrate, the chip and its carrier may be completely tested to ensure proper operation before the chip and its carrier are assembled in a stack. The several chip layers, comprising the carrier and chip, are then stacked on a stacking fixture or stacking base with all the sealing strips in contact with one another and with top via pads of one layer in contact with and orthogonally oriented relative to the bottom via pads of the next upper layer. The stack is assembled on a group of three mutually parallel vertical alignment pins (not shown) fixed on a fixed stacking fixture base and protruding vertically through the respective alignment openings 100,102 and 104 of each of the carriers and stack layers, including the lid 132 and the lower layer 134. The stack, held with its several carriers mutually aligned by the alignment pins, is placed in an oven and weighted to press the layers against one another. The assembly is heated to cause the solder to soften and/or melt and to form solder joints between connecting seal strips and mutually contacting via pads to provide strong, reliable, mechanical, electrical and thermal connections between the stacked carriers.

The various carriers are subject to thermal contraction and expansion as they are fired and thereafter cooled. Because the various layers may have different thermal coefficients of expansion than the base of the stacking fixture, and because even similar materials of the different carriers may themselves have slightly different coefficients of thermal expansion, the elongated registration apertures 100,102 and 104, extending in mutual vertical alignment through all of the stacked carriers are provided to enable accommodation of the assembled carriers to differentiate thermal expansion and contraction. As previously mentioned, each of these openings is elongated and has a longitudinal axis. The longitudinal axis of each opening intersects the geometric center of the carrier layer. Each carrier layer will thermally expand or contract equally in all directions from its geometric center, and thus the elongated registration openings, elongated in the direction of a line to the geometric center, allow such a thermally induced change in dimension without loss of alignment of one layer with the next. Since all of the openings are referenced to the geometric center of the layer rather than to any single edge, there is required a tolerance of only one-half of that which would be required if the registration openings are referenced from an edge of the layer. Thus, this unique arrangement of elongated registration openings, aligned with the geometric center of the carriers, greatly eases dimensional tolerance in manufacture of various layers, simplifies the assembly procedure and decreases cost of assembly.

Having fired the stack, it is removed from the oven and the complete hermetically sealed package is available for incorporation and/or mounting of the stacks by means of the solder bumps 156,158,160, etc. to another device, such as a printed wiring board or a multi-chip module or similar structure.

The reflow solder employed for the vias pads and seal strips is a high temperature solder, having melting point that is as much as 70° higher than the low temperature solder employed for the mounting solder bumps or pads 156,158, 160 (FIG. 4). Accordingly, when the latter are softened or melted for connection and mounting of the entire stack, the integrity of the stack internal solder interconnections is not affected. The solder bumps 156,158,160 may be positioned in wells on the printed wiring board or the multi-chip module and reflowed to provide mechanical and electrical connection.

The solder interconnections also provide good thermal paths throughout the entire length of the stack from top to bottom and also from inside to outside because of the close proximity of one solder pad to another and to the perimetral hermetic seal.

Alternatively, tape automated bonding structures may be attached to the lower solder bumps 156,159,160, with the tape automated bonding structures extending past the edges of the stack so that outer leads of the bonding structure may then be connected to pads on a printed wiring board or multi-chip module.

The thin dielectric ring-shaped cover layer 110 that surrounds each of the via pads acts as a solder dam to prevent flowing or wicking of solder from one pad to another or from one pad to exposed leads of the traces. This dielectric ring-shaped layer 110 acts as a solder dam, at least in part because it effectively prevents flow of solder along its surface.

Figure 5:
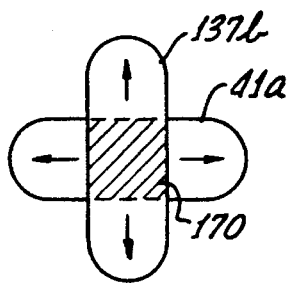
FIG. 5 illustrates the relative orientations of a pair of interconnected via pads on adjacent layers.

An important feature of the present invention is shown in FIGS. 2 and 3 and more conceptually illustrated in FIG. 5.

FIG. 5 illustrates a via pad, such as pad 41a of the top side of via 40 of a lower carrier layer and a corresponding contacting via pad, such as pad 137b at the bottom side of an immediately adjacent relatively upper layer.

As can be seen in FIG. 5, each of the via pads has a length of approximately three times its width, with its width being approximately equal to the diameter of the associated via, which is in the order of about 5 mils. With the illustrated arrangement there is a contact area between the two mutually perpendicular pads, when precisely oriented, with the contact area being indicated by the shaded area 170. This contact area is nominally a square with an equal length of non-contacting via pad extending on all four sides of this square. These mutually orthogonal contacting pads greatly ease dimensional tolerance limitations because they allow for misalignment of one pad with a contacting pad by a distance equal to as much as one-third of its length in either direction without diminishing the contacting area indicated by shaded area 170. For example, even if there should be a misalignment to the right or to the left or up or down, as viewed in FIG. 5, the contacting area 170 still remains as a square having the same area, until the misalignment becomes greater than one-third the full length of the elongated pad. If the pads were of equal or comparable shape and size to one another, any such misalignment would cause an overlap in the contacting of the pads and at least a partial relative displacement, and thereby would significantly decrease the contacting area. Accordingly, the orthogonal orientation of each pair of contacting pads provides for a uniform area of contact, even in the presence of some misalignment, and thereby ensures that each contacting area provides a uniform electrically conductive area, mechanical bond strength, and thermal path area. Moreover, the areas of the pads outside of the contacting shaded area 170 will direct any excess flow of contacting solder and confine it to the area of the pad. In other words, any excess flowing solder which may occur during the reflow process will flow in the direction of the arrows shown in FIG. 5 and be confined to the pad area. The elongated pads do not significantly impact upon available area for positioning of traces since portions of some of the traces may be readily routed beneath the areas of the pads that project beyond the common contacting or shaded area. By maintaining uniformity of the contacting area, and thereby uniformity of thermal path area, of mechanical strength and of electrical path area at each via pad connection, the system is greatly improved. Mechanical strength is improved because mechanical failure generally occurs at the weakest mechanical point, that connecting area in which the solder interconnection from one via pad to the other has a decreased area because of misregistration. Electrical uniformity occurs because of the uniformity of the contacting area and similarly thermal conductivity from pad to pad, and thereby from top to bottom of the entire stack, is increased for each thermal path that extends through aligned vias from top to bottom of the stack.

Input/output connections to the stack are made through the via pads at the bottom 156,158 and 160, and further input/output connections are made to the via pads 137a,139a and 141a on the lid or uppermost layer 132. Each carrier is connected to all other carriers, and to external input/output connections (e.g., the outermost via pads) through the many vias which extend completely through the stack and all carriers. As can be readily seen from FIGS. 2 and 3, the number of these input/output connections, that is the total number of via pads available in any one horizontal outside layer (namely the uppermost and lowermost layers), is very large, and thus a significant increase in the number of input/output connections to the stacked chips is available with the arrangement of the present invention.

A stack embodying principles of the present invention will exhibit dramatic decreases in size, weight and power. The decrease in size and weight is due to the decreased overall volume of the stack, which allows utilization of all of the chip pads and provides a large number of input/output connections. The number of these connections is not constrained or restricted by the area of the side of the stack. Further, because of the compact arrangement and the mode of interconnection of chips from one layer to another, the total length of leads employed internally of the stack is less, and, importantly, the length of individual leads is less. Because of this decrease in lead length, the stray capacitance of the package is greatly reduced. Stray or distributed capacitance, as is well known, may cause power losses in excess of fifty percent. Because the power loss is related to the stray or distributed capacitance of the circuit, performance is enhanced by greatly decreased power loss. Further, the shorter length of leads not only decreases the stray capacitance, it decreases the travel time of signals within the package, thereby enhancing speed. Accordingly, circuit performance is enhanced because of the decrease in capacitance and the decreased time of travel of signals within the package allowing greater component and system operating speeds.

Total thickness of each individual carrier may vary between 18 and 70 mils depending upon the number of layers in the carrier substrate and the thickness of the integrated circuit chips which are mounted on each carrier substrate. Chips vary in size and thickness and may have a thickness of between 5 and 25 mils and a rectangular configuration of from about 0.50 to 1.0 inches or more per side. A total carrier thickness is in the order of about 10 to 12 mils greater than the thickness of the chip that it carries. Note that each cavity of one layer carrier partially receives the chip mounted on the top side of the next lower carrier and also provides some space for the bonding wire. Limits on the number of possible carriers (and chips) in a stack are not presently known, but it is contemplated that a stack may have a height of up to 50 layers (e.g., 50 carriers, each with a chip thereon), with about a total of 0.020 inches for each chip layer (e.g., carrier plus chip). If a stack is laid on its side, the total number of layers may be significantly greater. In an exemplary single chip carrier the carrier substrate has a total thickness of 0.027 inches, with the center portion of the substrate, above the cavity, having a thickness of 0.009 inches. The outer carrier dimensions, in one example, are 0.790×0.790, and the cavity is 0.535×0.485 inches.

Although a wire bond connection of the integrated circuit chip to the layer traces is illustrated, it will be readily understood that other types of mounting of the chip on the substrate may be employed. For example, flip-chip mounting may be employed in which the chip is turned upside-down with its connecting pads facing the substrate on which it is mounted. The substrate has appropriate connecting pads for electrically connecting to the flipped over chip. The various traces can either be screened on or plated on. The flip-chip may be connected using either tape automated bonding or solder bumps.

Preferably, the solder employed on the high temperature solder bumps is a fluxless solder to prevent parasitic effects that may result from the use of flux.

The stack of layers provides an alignment of vias that extends from top to bottom of the stack to provide a continuous electrical and thermal path. The various chip leads and traces on each carrier, and on each layer of each multi-layer carrier, may be connected to one or another or any group of the vias so that any chip of the stack may be connected to leads on its same carrier and also to leads connecting to chips on other carriers. Accordingly, chips in any one stack may be interconnected to one another as desired or may be simply coupled to input/output via connecting pads without connection to any other chip in the stack.

Because the sealing strip is essentially made in the same fashion as are all of the traces and via pads, excepting that it is additionally coated with a reflow solder that is not applied to the conductive traces, the sealing is greatly simplified without compromise of sealing effectivity. No special types of materials or sealing rings are needed to be fabricated or assembled.

There have been described methods and apparatus for forming a stack of integrated circuit chips to provide an hermetically sealed package of minimum size and weight and greatly decreased power loss. A maximized number of input/output connections is available from a plurality of aligned vias that collectively extend from top to bottom of the stack, providing arrays of input/output connections on upper and lower surfaces of a stack rather than merely on peripheral edges. Simple precision alignment of the layers of the stack, allowing thermally induced dimensional changes, is provided by use of elongated registration openings, each having an axis that intersects the geometric center of each of the associated layers.

What is claimed is:

1. A multi-die package comprising:

a plurality of stacked chip layers, each said chip layer comprising:

a carrier substrate having top and bottom sides, a plurality of electrically conductive vias extending through said carrier substrate between said top and bottom sides, each said via having electrically conductive top and bottom via pads on the top and bottom sides of the carrier substrate, wherein each said via pad is oblong and has a major axis, and wherein the major axis of the pad of the top side of each via is angulated relative to the major axis of the pad of the bottom side of the same via, a pattern of electrically conductive traces formed on the top side of said carrier substrate, at least some of said traces having an outer end connected to one of said via pads, a chip mounted on said top side of said substrate and having a plurality of chip pads, and an electrical connection between each of said chip pads and one of said traces, said chip layers being arranged in a stack of chip layers with the vias of one carrier substrate aligned with the vias of an adjacent carrier substrate and with the via pads on top and bottom sides of each carrier substrate being electrically connected to via pads on respective bottom and top sides of adjacent carrier substrates.

2. The package of claim 1 wherein each said carrier substrate has a geometric center and wherein each includes at least three elongated alignment openings each having a longitudinal axis that intersects said geometric center, each said opening being positioned near the periphery of said carrier substrate, two of said openings being positioned on opposite sides of said geometric center and having mutually aligned axes and a third one of said openings having an axis that is angulated relative to the axes of said two openings.

3. The package of claim 1 wherein each said carrier substrate includes a continuous peripheral seal strip on both top and bottom sides, the seal strips on the top and bottom sides of each carrier being hermetically sealed to the seal strips on the bottom and top sides, respectively, of adjacent carrier substrates.

4. The package of claim 3 including a lid having a plurality of vias registered with the vias of said carrier substrates and electrically connected thereto, and a continuous peripheral sealing strip on the bottom side of said lid congruent with and sealed to a sealing strip on the top side of an uppermost one of said carrier substrates, thereby providing a fully hermetically sealed package of stacked dies.

5. The package of claim 1 wherein the major axis of the pad of the top side of each via is orthogonal to the major axis of the pad of the bottom side of the same via, and wherein the via pad of the top of one carrier substrate is electrically and mechanically connected to a via pad of the bottom of an adjacent carrier substrate to form a pair of interconnected via pads, and wherein the major axis of the via pad of one pad of said pair is orthogonal to the major axis of the via pad of the other pad of said pair.

6. The package of claim 3 wherein said via pads comprise reflow solder pads, and wherein each carrier substrate includes on its top side a solder flow barrier interposed between the inner end of said leads and said via pads.

7. The package of claim 6 wherein said barrier comprises a thin dielectric cover overlying some of said traces.

8. The package of claim 1 including a lid having a plurality of electrically conductive lid vias aligned with respective ones of the vias in said carrier substrates and extending from bottom to top sides of said lid, each of said lid vias having an electrically conductive lid via pad on top and bottom ends thereof, the bottom pads of the lid vias being electrically connected to top pads of the vias of the uppermost one of said group of carrier substrates.

9. The package of claim 1 wherein at least one of said carrier substrates comprises a plurality of dielectric laminations, at least some of said electrically conductive traces being formed on different ones of said laminations.

10. The package of claim 1 wherein each of a group of said carrier substrates includes a cavity on its bottom side and wherein the chip on the top side of one of said carrier substrates is at least partially received within the cavity on the bottom side of an adjacent carrier substrate.

11. A chip carrier for use in forming a hermetically sealed stacked chip package, said carrier comprising;

a carrier substrate having top and bottom sides, a plurality of electrically conductive vias extending through said substrate between said top and bottom sides, each via of said plurality of vias having a respective electrically conductive top and bottom via pad at said top and bottom sides of said substrate, a pattern of electrically conductive traces formed on the top side of said substrate, at least some traces of said pattern of electrically conductive traces having an outer end connected to one of said via pads and having an exposed chip-connecting end, an electrical connection between each of said chip pads and one of said traces, a respective continuous peripheral seal strip on both said top and bottom sides of said carrier substrate, and a plurality of elongated alignment non-circular openings in said carrier substrate, each alignment opening of said plurality of alignment openings having a longitudinal axis that intersects the geometric center of said carrier substrate.

12. The chip carrier of claim 11 further including a chip mounted on said top side of said substrate and having a plurality of chip pads.

13. The chip carrier of claim 11 wherein said pattern of electrically conductive traces includes a plurality of electrically conductive traces, each trace of said plurality of electrically conductive traces having an exposed end configured and arranged for connection to a connecting pad of a chip to be mounted on said carrier substrate, and each one of said via pads includes a layer of reflow solder thereon, further including a solder barrier interposed between each of said via pads and the respective one of said exposed chip connecting ends of said plurality of traces.

14. The chip carrier of claim 13 wherein said solder barrier comprises a thin dielectric cover overlying at least some of said plurality of electrically conductive traces.

15. The chip carrier of claim 11 wherein said via pads on said top and bottom sides of said substrate are elongated and have longitudinal axes, and wherein said longitudinal axes of said top and bottom via pads at each via are mutually orthogonal.

16. The chip carrier of claim 11 wherein said carrier substrate includes a chip mounting area on one side, and defines a cavity in and opening to the other side of said substrate.

17. The chip carrier of claim 11 further including a lid member having a plurality of electrically conductive lid vias respectively aligned with vias of said carrier substrate and extending from bottom to top sides of said lid, each one of said plurality of electrically conductive lid vias having an electrically conductive lid via pad at respective top and bottom ends thereof, the bottom via pads of said lid vias being electrically connected to respective top pads of said vias of said carrier substrate.

18. The chip carrier of claim 11 wherein said carrier substrate includes a plurality of dielectric laminations, at least some traces of said pattern of electrically conductive traces being formed on different ones of said plurality of dielectric laminations.

* * * * *